(12) United States Patent
Wei et al.

(10) Patent No.: US 7,994,885 B2
(45) Date of Patent: Aug. 9, 2011

(54) HIGH-FREQUENCY SWITCH IN MULTI-LAYER SUBSTRATE

(75) Inventors: Chang-Lin Wei, Miao-Li (TW);
Ching-Liang Weng, Taipei (TW);
Uei-Ming Jow, Taichung (TW);
Ying-Jiunn Lai, Pintugn (TW); Syun Yu, Chia-I (TW); Chang-Sheng Chen, Taipei (TW)

(73) Assignee: Industrial Technology Research Institute, Hsin-Chu (TW)

( * ) Notice: Subject to any disclaimer, the term of this patent is extended or adjusted under 35 U.S.C. 154(b) by 0 days.

(21) Appl. No.: 12/860,739

(22) Filed: Aug. 20, 2010

(65) Prior Publication Data

US 2010/0314233 A1 Dec. 16, 2010

Related U.S. Application Data

(62) Division of application No. 11/157,068, filed on Jun. 20, 2005, now abandoned.

(30) Foreign Application Priority Data

Feb. 4, 2005 (TW) ................................ 94103505 A

(51) Int. Cl.
*H01H 51/22* (2006.01)
(52) U.S. Cl. ........................ 335/78; 361/277; 361/306.3
(58) Field of Classification Search ..................... 335/78; 361/277, 278, 292, 792–795; 174/255, 261–266
See application file for complete search history.

(56) References Cited

U.S. PATENT DOCUMENTS

| | | |
|---|---|---|
| 3,475,700 A | 10/1969 | Ertel |
| 6,014,066 A | 1/2000 | Harberts et al. |
| 6,556,416 B2 | 4/2003 | Kunihiro |
| 6,903,919 B2 | 6/2005 | Kayatani et al. |
| 6,999,299 B2 | 2/2006 | Shimizu et al. |
| 7,196,274 B2 | 3/2007 | Cooper et al. |
| 7,304,831 B2 | 12/2007 | Yoshii et al. |
| 2004/0099847 A1 | 5/2004 | Miura |

FOREIGN PATENT DOCUMENTS

| | | |
|---|---|---|
| JP | 2004357037 A | 12/2004 |
| TW | 561696 B | 11/2003 |

*Primary Examiner* — Anh T Mai
*Assistant Examiner* — Bernard Rojas
(74) *Attorney, Agent, or Firm* — Stout, Uxa, Buyan & Mullins, LLP

(57) ABSTRACT

A switch module consists of a build-up multi-layer structure and some passive devices. The build-up multi-layer structure has multitudes of conductive layers and dielectric layers laminated upon each another. At least one dielectric layer is interfered between any two conductive layers. Any one passive device is a portion of at least one conductive layer and electrically connects multitudes of conductive pads on the surface of the build-up multi-layer structure.

7 Claims, 14 Drawing Sheets

HIGH-FREQUENCY SWITCH IN MULTI-LAYER SUBSTRATE

CROSS-REFERENCE TO RELATED APPLICATIONS

This application is a divisional of U.S. application Ser. No. 11/157,068, filed on Jun. 20, 2005, which claims the benefit of Taiwan Patent Application No. 094103505, filed on Feb. 4, 2005, the entire contents of both which are hereby incorporated by reference.

BACKGROUND OF THE INVENTION

1. Field of the Invention

The present invention relates generally to a switch structure for wireless communication, and more particularly to provide a structure for manufacturing a RF SPDT switch by reference to a build-up multi-player.

2. Description of Related Art

Low cost and miniaturization are one of the important goals for wireless communication, digital computers and portable electronic apparatus. For example, since the RF (Radio Frequency) switch of a RF front-end module controls the select antenna, switches between the antenna end and receiver end, and switches between the antenna end and transmitter end, it's one of the key components for wireless communication.

A RF switch is composed of ICs and passive devices, and since the passive devices of the current RF switch are restricted to the surface mount devices, it's not efficient for minimizing the usage area of the circuitry board even if the layout of the circuitry is changed, and remain restricted to miniaturization process.

SUMMARY OF THE INVENTION

With respect to the tendency of miniaturization for high-speed wireless communication products, a structure for a RF switch is proposed herein. Comparing to surface mount devices, to integrate each kind of passive device into a multi-layer board may efficiently reduce numbers of components.

Moreover, for designing a low-cost RF switch, herein a build-up multi-layer structure within passive devices is provided. By utilizing inner, outer conductive layers and the contacted conductive connection structure thereof, it's able to manufacture surface-type and built-in passive devices.

For providing the needed RF switch of wireless communication, furthermore, a single-pole double-throw (SPDT) switch module is provided. Except to diodes, other essential passive devices could be made in the way of manufacturing a build-up multi-layer and thus no surface mount technique (SMT) is needed to combine passive devices, thereby reducing the volume or area of wireless communication products.

Accordingly, in an embodiment of the invention, a SPDT switch module composed of a build-up multi-layer structure and several passive devices is presented. A build-up multi-layer structure includes a plurality of conductive layers and a plurality of dielectric layers laminated upon each another, wherein there is at least one dielectric layer being interfered between any two conductive layers. Any one passive device is a portion of at least one conductive layer and electrically connects multitudes of conductive pads on the surface of the build-up multi-layer structure.

DETAILED DESCRIPTION OF THE INVENTION

Diagrams of embodiments of the present invention will be described in detail in the following. Beside the detailed descriptions, diagrams for representing a build-up multi-layer are enlarged but the scope of the present invention should not be regarded as limiting to those diagrams. In addition, a practical build-up multi-layer may comprise other essential components of the structure.

Moreover, though some embodiment diagrams are illustrated with single component or structure only, the scope of the present invention is not limited to. When the following descriptions that do not enhance on the limitation of numbers, spirit and the scope of the present invention should be expanded to cover the methods or structures with multiple components.

Figure 1A:
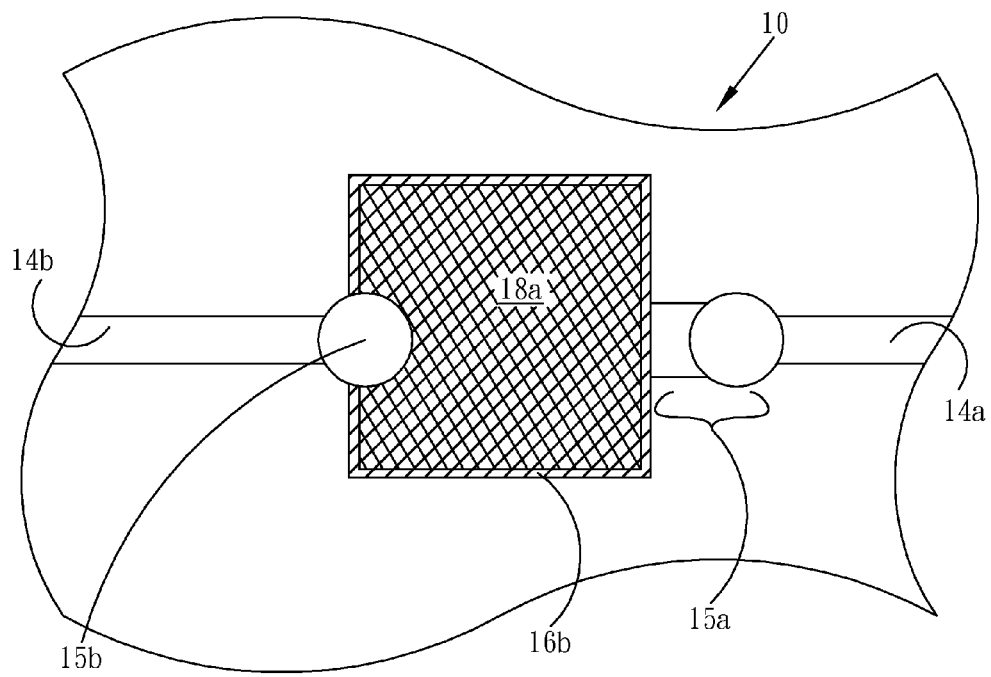
FIG. 1A is a front perspective view of a built-in capacitance in accordance with a first embodiment of the present invention.

FIG. 1A depicts a front perspective view of a built-in capacitor (or embedded capacitor) in accordance with the first embodiment of the invention. In a build-up multi-layer structure 10, any two adjacent inner conductive layers (separated by a dielectric layer) paralleled to each another forms an upper polarization plate 16b and a lower polarization plate 18a, wherein the upper polarization plate 16b contacts and pierces through the conductive connection structure (not shown in the drawing) of the build-up multi-layer structure 10 to connect to a conductive pad 14b upon the outer conductive layer. The lower polarization plate 18a contacts and pierces through the conductive connection structure 15a, 15b to connect to a conductive pad 14a located upon the outer conductive layer. According to the conductive pads 14a and 14b locating upon the outer conductive layer, it is connectable to the outside for controlling the built-in capacitor.

Figure 1B:
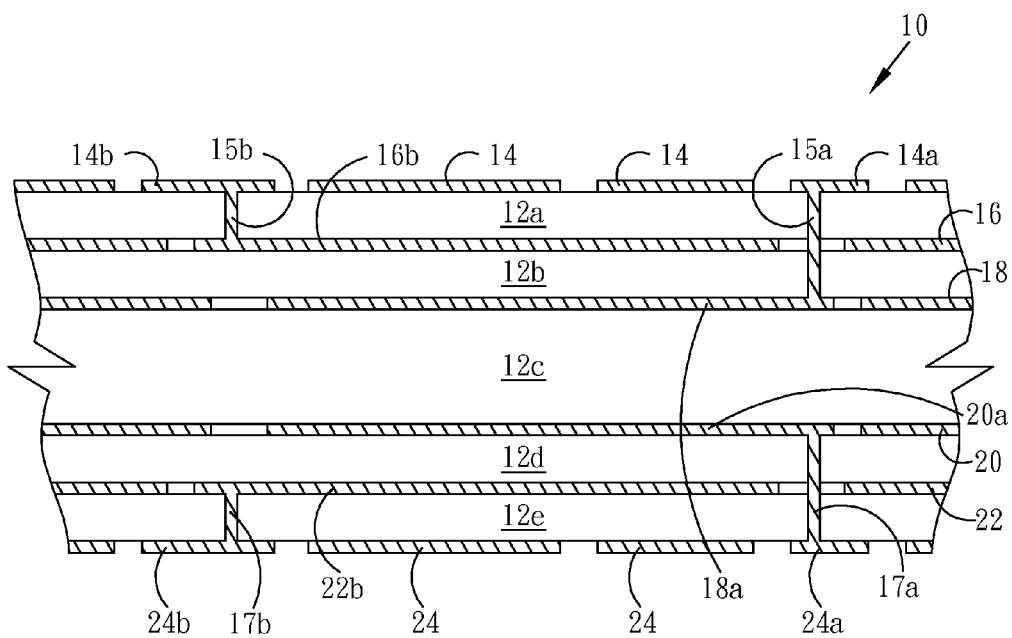
FIG. 1B is a sectional view of the built-in capacitance in accordance with the first embodiment of the present invention.
Figure 1C:
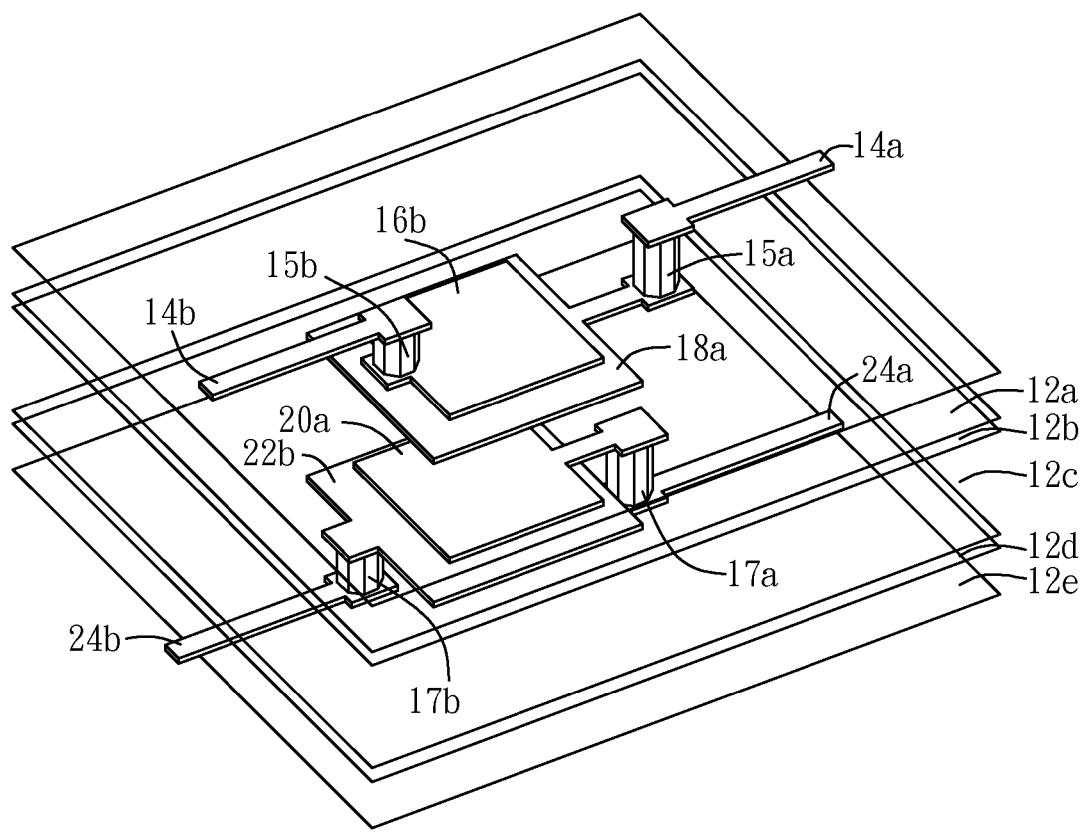
FIG. 1C is a pictorial perspective view of the built-in capacitance in accordance with the first embodiment of the present invention.

FIG. 1B depicts the sectional view of the built-in capacitor in accordance with the first embodiment of the present invention. FIG. 1C is a pictorial perspective view of the built-in capacitance in accordance with the first embodiment of the present invention. The build-up multi-layer structure 10 is formed of a plurality of conductive layers, in which a dielectric layer is interfered between any two adjacent inner conductive layers. In an embodiment of the invention, the build-up multi-layer structure 10 comprises the parallel inner conductive layers 16, 18, 20 and 22 and outer conductive layers 14 and 24, wherein each conductive layer is separated by dielectric layers 12a, 12b, 12c, 12d and 12e respectively. Considering the data transmission, in a preferred embodiment of the invention, dielectric layers 12a and 12b may be made of the same material, for example the RCC/pre-preg of low dielectric constant, as applying to a symmetrical build-up structure, thereby reducing the power loss and the propagation delay under a high-frequency/high-speed transmission. Dielectric layers 12b and 12d may also be made of the same material, for example the RCC of a high dielectric constant, to design the built-in capacitor. Dielectric layer 12c may be made of a core substrate material for improving the mechanical intensity of the whole structure. Noticed that, however, the material of each dielectric layer mentioned above is not limited.

Moreover, the inner conductive layers 16, 18, 20, and 22 are made of thin copper foil plates, after a general circuit layout and black/brown process, they further laminate with the outer conductive layers 14, 24 and the dielectric layers 12a, 12b, 12c, 12d and 12e by a build-up method. In this embodiment, layouts of the inner conductive layers 16, 18, 20, 22 comprise upper and lower polarization plates 16b, 18a and 20a, 22b of capacitance devices, wherein the paired upper and lower polarization plates 16b, 18a separated by the dielectric layer 12b is of particular and similar-sized geometrical shapes, for example a rectangle, to satisfy the demand for a capacitor. Next, the position thereof is almost overlapped completely, and is not electrically connected with the other circuit lines of its existing inner conductive layer, so does the paired upper and lower polarization plate 20a and 22b. Furthermore, the paired upper and lower polarization plates 16b, 18a (or 20a, 22b) have to connect and contact the conductive pads 14b, 14a (or 24a, 24b) placing upon the outer conductive layer 14 (or 24) by piercing through the conductive connection structures 15b and 15a (or 17a, 17b). In the embodiment, the conductive connection structures 15b, 15a, 17a and 17b comprise a conductive blind hole, a conductive buried hole penetrating at least a dielectric layer, which can be connected to other conductive blind holes or buried holes by a portion of conductive tracking lines or connecting pads upon the inner conductive layers.

According to above-mentioned descriptions, the spirit of the present invention is to utilize the up-and-down symmetrical characteristics of the build-up multi-layer structure 10 to proceed a double-side layout design, thereby reducing the module's size and cost. Next, the build-up multi-layer structure 10 in the embodiment is manufactured by the 2+2+2 build-up method of a higher yield, which also reduces the cost. It's noticed that, the build-up multi-layer 10 of the present invention is not limited to a six-layer plate but also applies to the four, eight or ten layer build-up multi-layer structure.

Figure 1D:
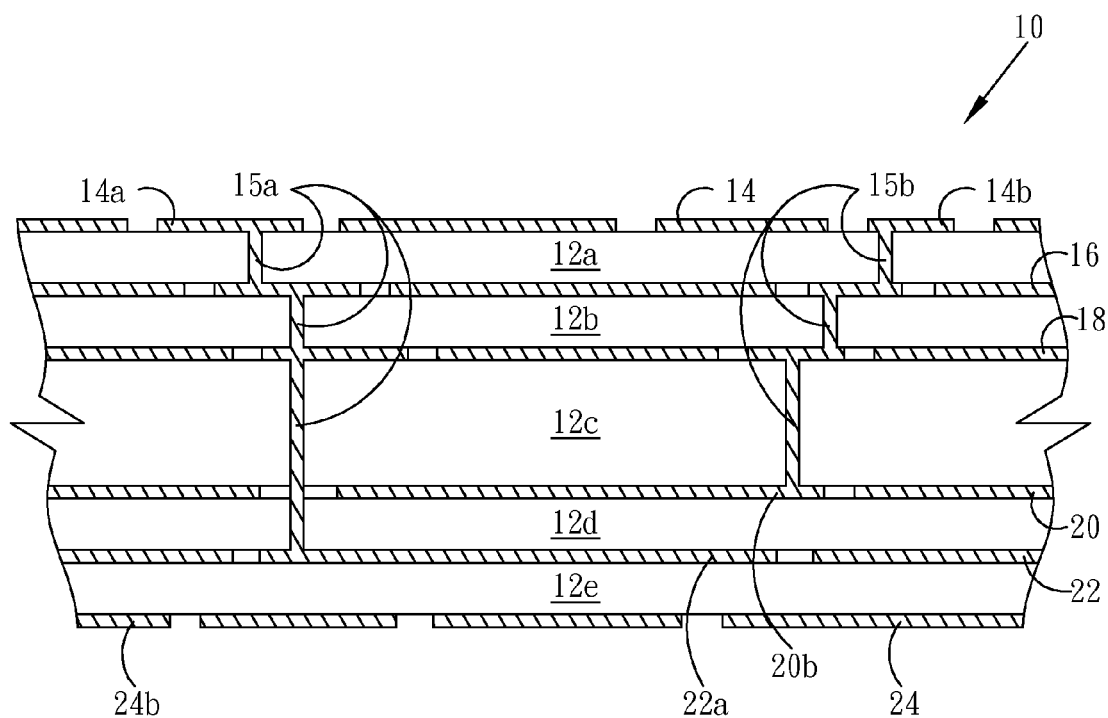
FIG. 1D is a sectional view of a built-in capacitance in accordance with a second embodiment of the present invention.
Figure 1E:
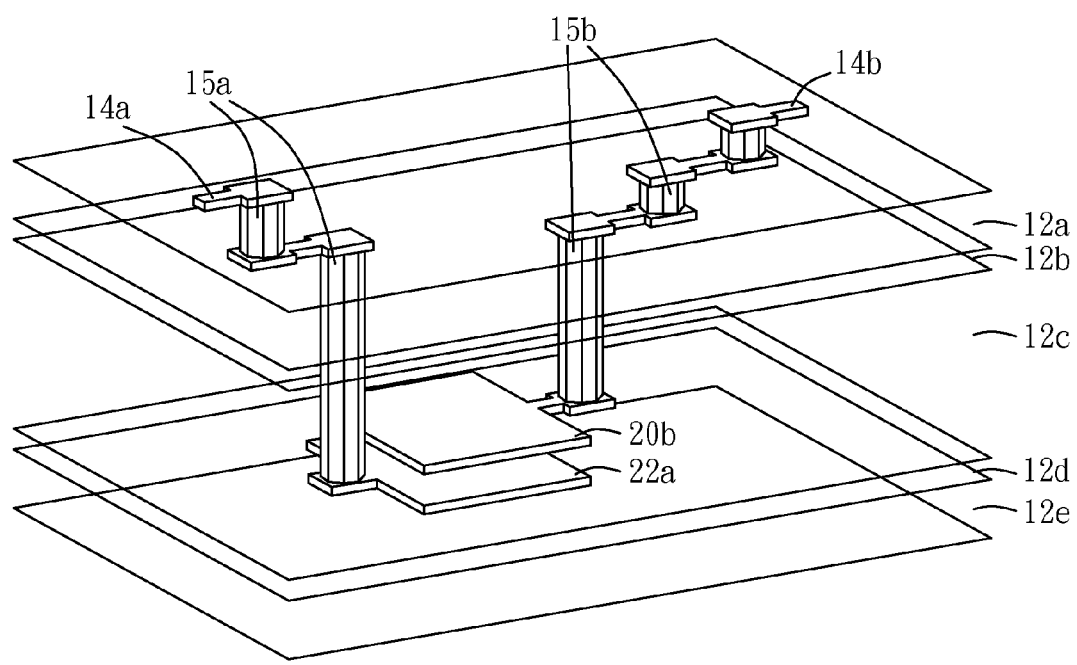
FIG. 1E is a pictorial perspective view of the built-in capacitance in accordance with the second embodiment of the present invention.

FIG. 1D is a sectional view of a built-in capacitor in accordance with the second embodiment of the present invention. FIG. 1E is a pictorial perspective view of the built-in capacitance in accordance with the second embodiment of the present invention. The build-up multi-layer structure 10 comprises inner conductive layers 16, 18, 20, 22 and outer conductive layers 14, 24, wherein each is separated by a dielectric layer 12a, 12b, 12c, 12d, and 12e sequentially. The major difference to the first embodiment is, the present second embodiment lays out one or multiple built-in capacitors merely on a single side. Presently, the upper and lower polarization plates may respectively be placed upon any two adjacent inner conductive layers, as shown in the drawing, the upper and lower polarization plates 20b and 20a are placed upon the inner conductive layers 20 and 22 respectively. It's understood that, now the conductive connection structures 15a and 15b are respectively composed of conductive blind holes, conductive buried holes penetrating multiple dielectric layers, and the conductive tracking lines or connecting pads that connect the conductive blind holes or the conductive buried holes penetrating the different dielectric layers.

Figure 2A:
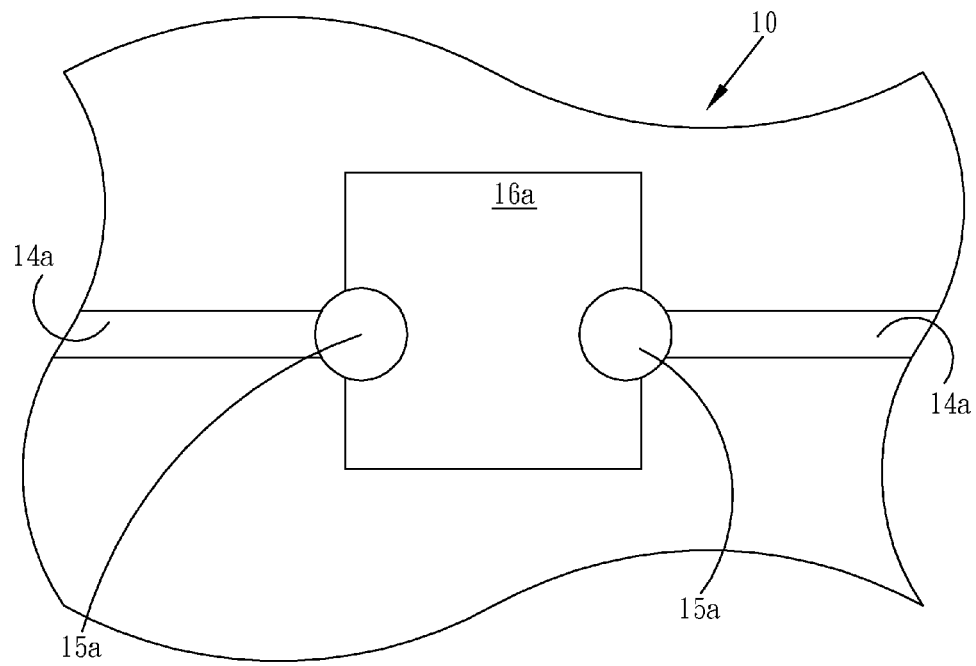
FIG. 2A is a front perspective view of a built-in resistance in accordance with the first embodiment of the present invention.

FIG. 2A depicts a front perspective view of a built-in resistor (or embedded resistor) in accordance with the first embodiment of the invention. The principal part of resistor 16a is placed on any conductive layer, which connects to a conductive pad 14a upon outer conductive layer by contacting and piercing through several conductive connection structure 15a of the build-up multi-layer structure 10. With the conductive pad 14a upon outer conductive layer, it's connectable to the outside for controlling the built-in resistor.

Figure 2B:
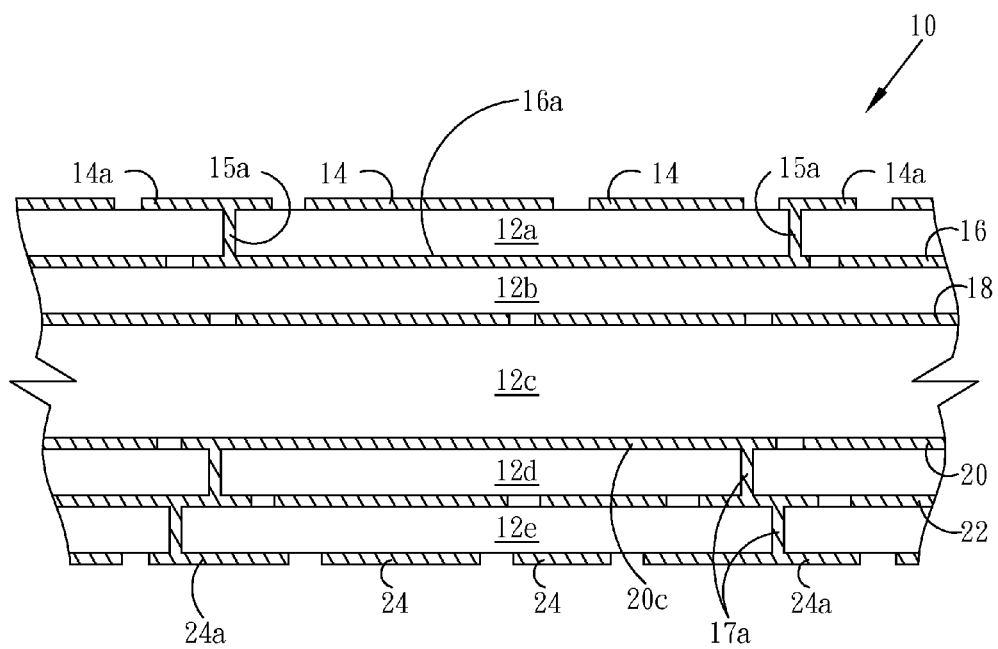
FIG. 2B is a sectional view of the built-in resistance in accordance with the first embodiment of the present invention.
Figure 2C:
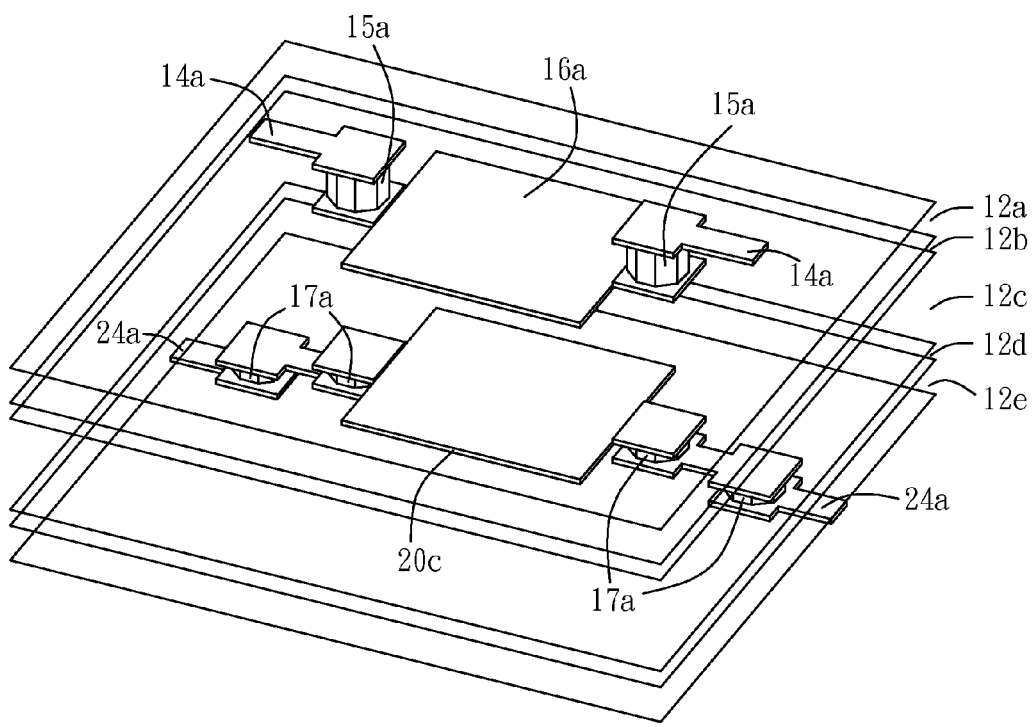
FIG. 2C is a pictorial perspective view of the built-in resistance in accordance with the first embodiment of the present invention.

FIG. 2B depicts the sectional view of the built-in resistor in accordance with the second embodiment of the present invention. FIG. 2C is a pictorial perspective view of the built-in resistance in accordance with the first embodiment of the present invention. As well as manufacturing a built-in capacitor, the build-up multi-layer structure 10 comprises inner conductive layers 16, 18, 20, 22 and outer conductive layers 14, 24, wherein each is separated by dielectric layer 12a, 12b, 12c, 12d, and 12e sequentially. Some principal parts of resistor 16a or 20c are respectively placed on any inner conductive layers 16 or 20, have geometry shapes of particular size, and are not electrically connected with other circuit lines upon their exiting inner conductive layers. Moreover, the principal part of the resistor 16a or 20c contacts the conductive connection structure 15a or 17a, for instance the conductive blind holes, at the edges or terminals of the geometrical shape, and be contacted/connected to the conductive pad 14a (or 24a) placing upon the outer conductive layer 14 by reference to the conductive connection structure 15a or 17a.

Figure 3A:
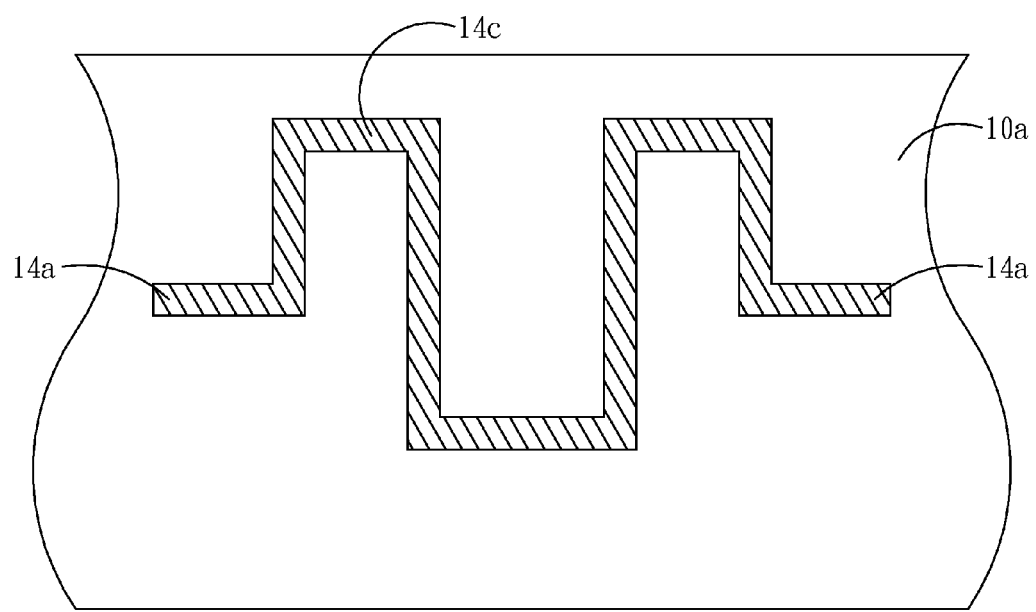
FIG. 3A is a front view of a surface inductance in accordance with the first embodiment of the present invention.
Figure 3B:
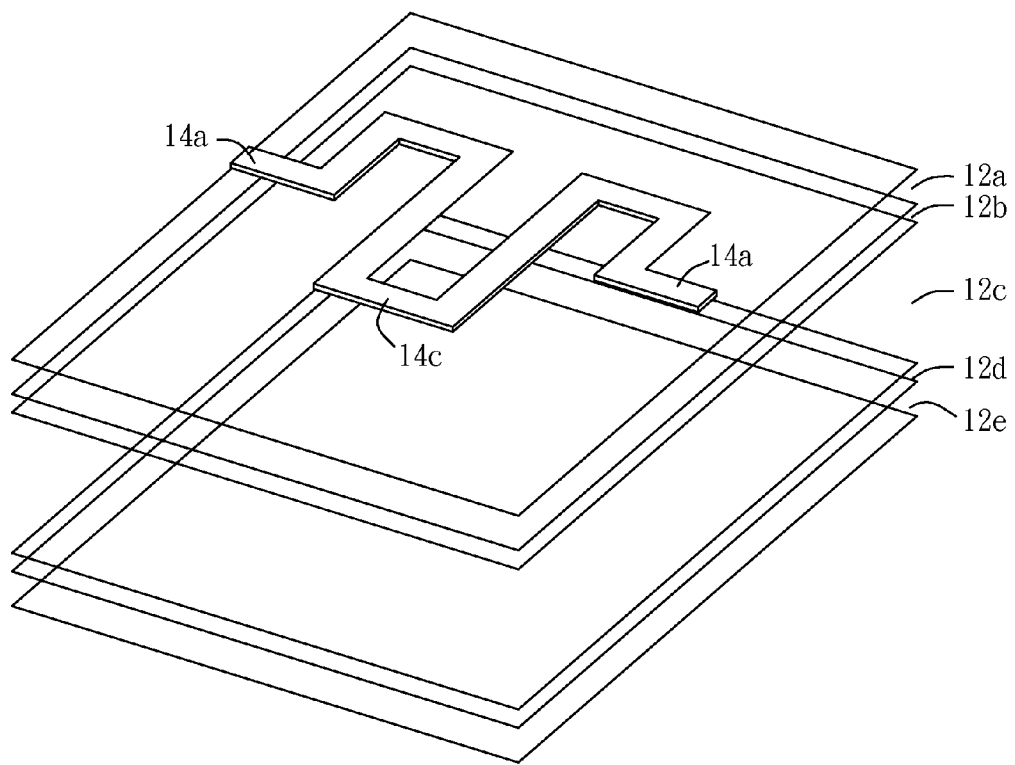
FIG. 3B is a pictorial perspective view of the surface inductance in accordance with the first embodiment of the present invention.

FIG. 3A is a front view of a surface inductor manufactured in accordance with the first embodiment of the invention. FIG. 3B is a pictorial perspective view of the surface inductance in accordance with the first embodiment of the present invention. There are one or few surface inductors and other conductive lines (not shown in the drawing) located upon a surface 10a of the build-up multi-layer structure 10. Each surface inductor is formed of a conductive coil 14c paralleled with each other and terminals of the conductive coil 14c contacted with two conductive pads 14a. Numbers of coils, width and length of the conductive coil 14c vary for different demands, and the geometrical shape, size thereof also varies accordingly, which is not limited to the drawings.

Figure 3C:
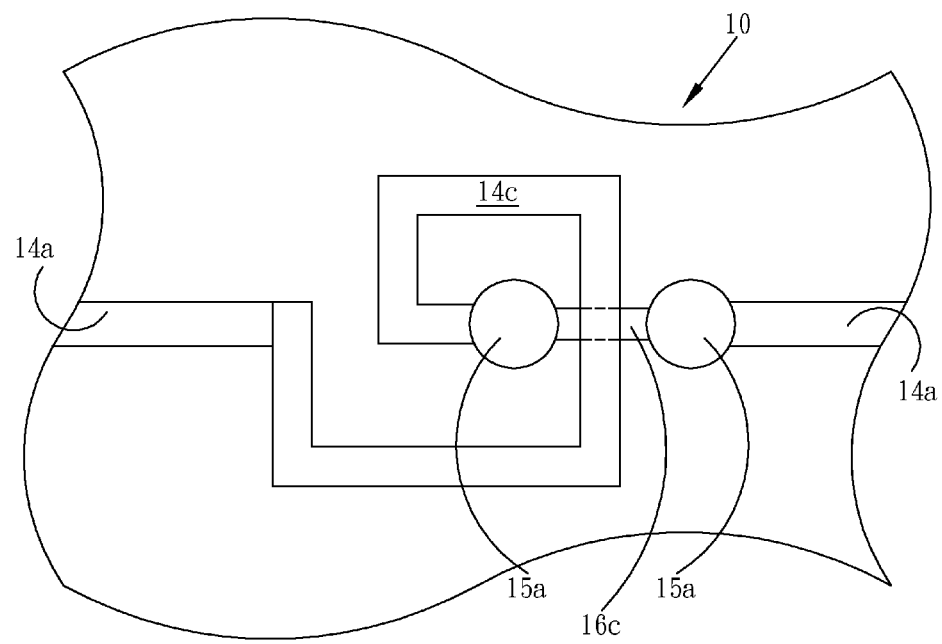
FIG. 3C is a front view of an inductance device in accordance with the second embodiment of the present invention.

FIG. 3C is a front view of an inductance device manufactured in accordance with the second embodiment of the present invention. The difference to the first embodiment lies on that at least one conductive coil 14c is distributed in concentric circles. Moreover, although one terminal of conductive coil 14c and any conductive pad 14a are placed on the same surface 10a, both of them are contacted and connected with each other according to the conductive connection structure 15a and conductive tracking line 16c. In this embodiment, the conductive connection structure 15a is composed of conductive blind holes connecting to one terminal of the conductive coil 14c with any conductive pad 14a and the conductive tracking line 16c between therein, wherein the conductive tracking line 16c is placed on any inner conductive layer.

Figure 3D:
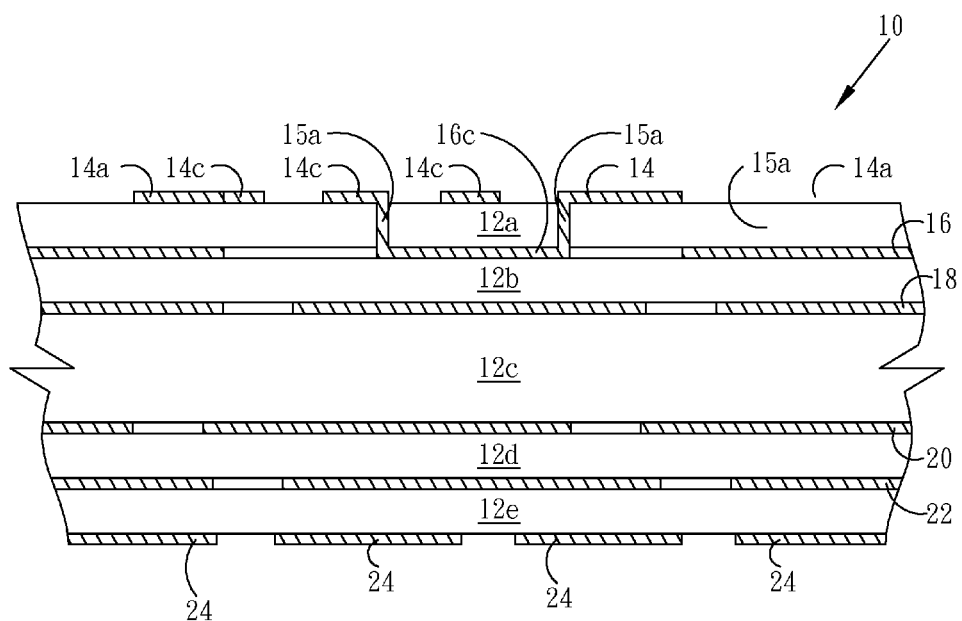
FIG. 3D is the sectional view of the built-in inductance shown in FIG. 3C.
Figure 3E:
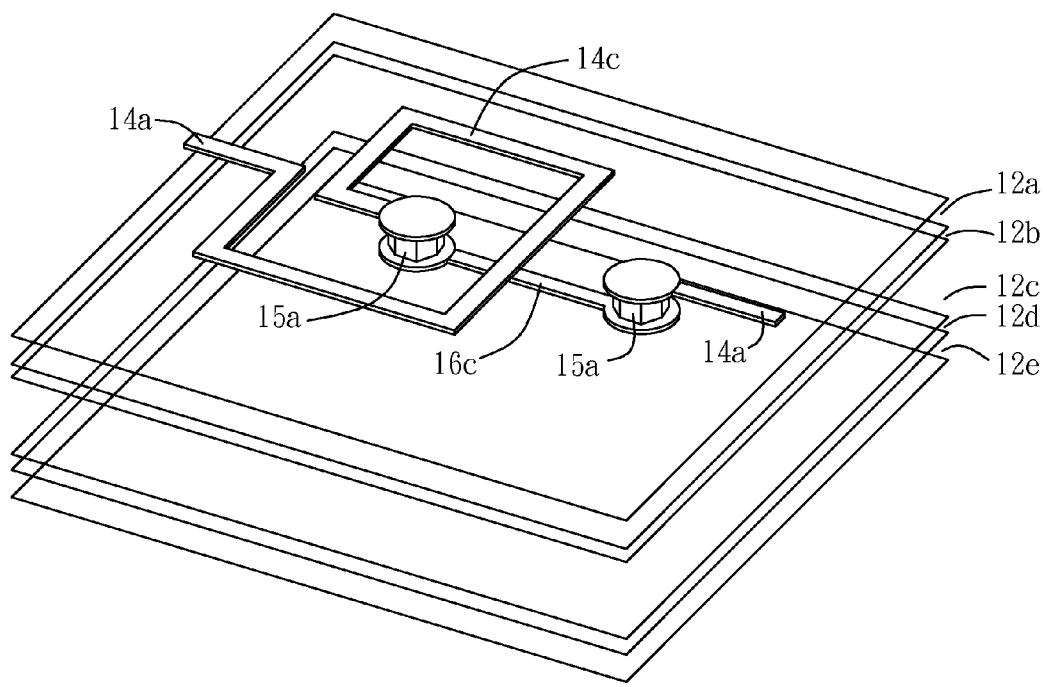
FIG. 3E is a pictorial perspective view of the inductance device in accordance with the second embodiment of the present invention.

FIG. 3D is the sectional view of FIG. 3C. FIG. 3E is a pictorial perspective view of the inductance device in accordance with the second embodiment of the present invention. The build-up multi-layer structure 10 contains inner conductive layers 16, 18, 20, 22 and outer conductive layers 14, 24, wherein each is separated by dielectric layers 12a, 12b, 12c, 12d, and 12e respectively. Two conductive pads 14a and conductive coil 14c are placed on the outer conductive layer, and the conductive connection structure 15a contains conductive tracking lines 16c placed on the inner conductive layer 16 and the conductive blind holes connecting to two terminals of the conductive coil 16c. It's understood that, conductive tracking lines and the conductive blind holes connecting with the conductive tracking lines are not limited to the drawing, multi-layer conductive blind holes and the multi-layer conductive tracking lines also do not depart the scope of the present invention.

Figure 4:
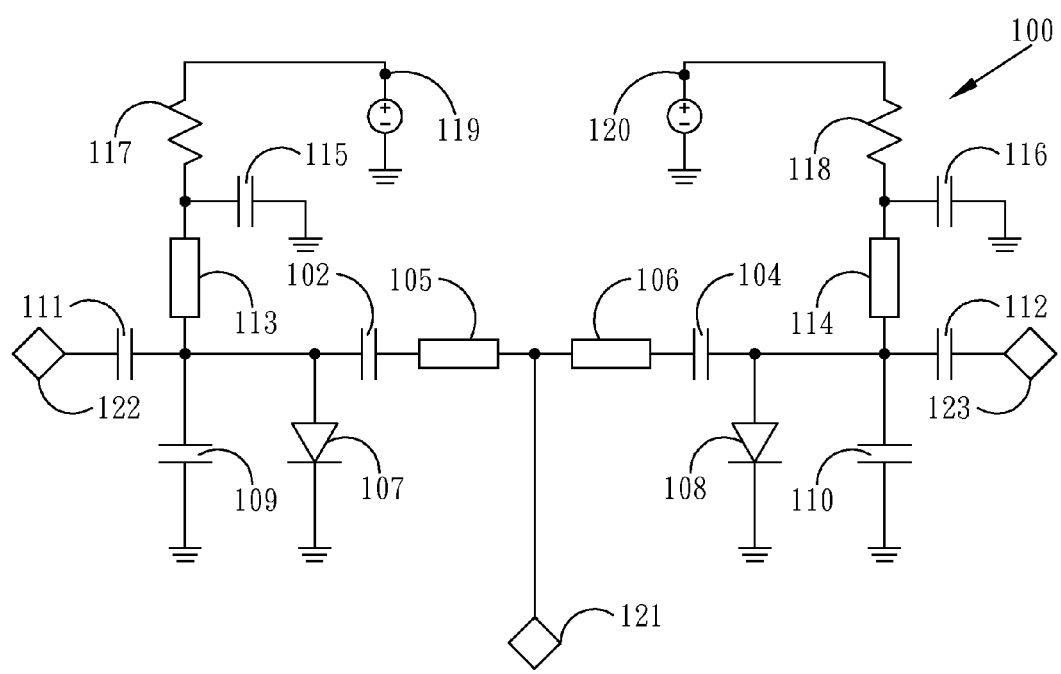
FIG. 4 depicts a layout diagram, which illustrates an embodiment electronic module having each device.
Figure 4A:
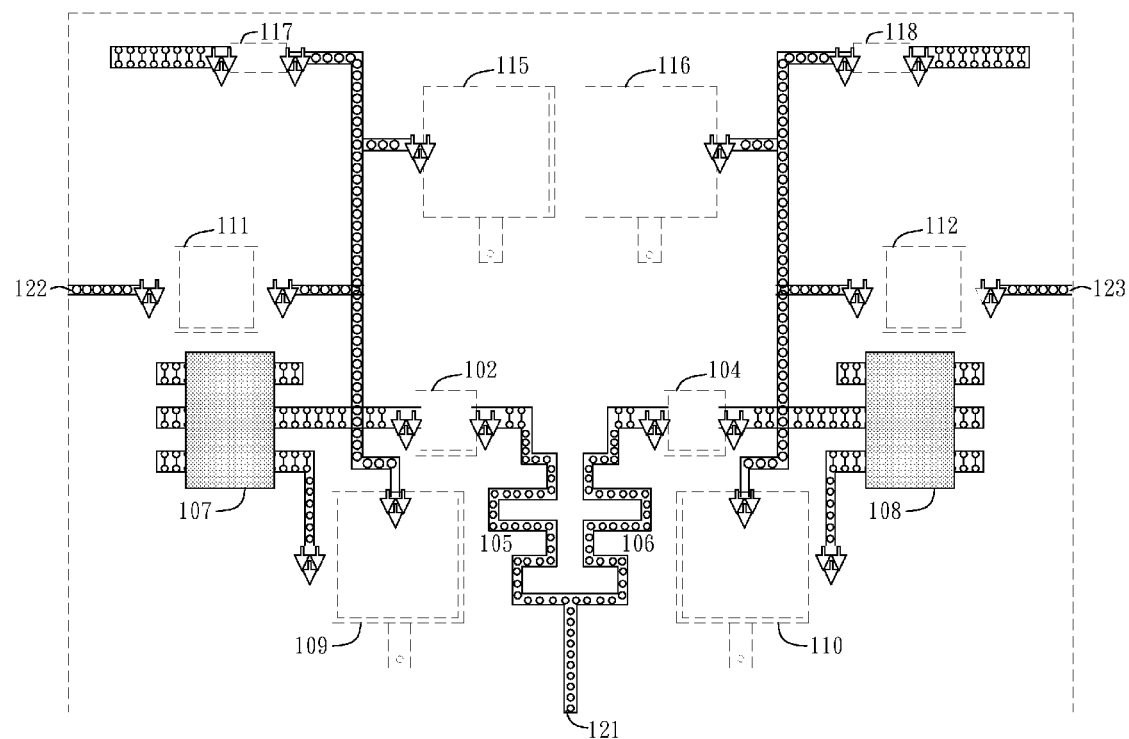
FIG. 4A is a schematic diagram of the electronic module shown in FIG. 4.
Figure 4B:
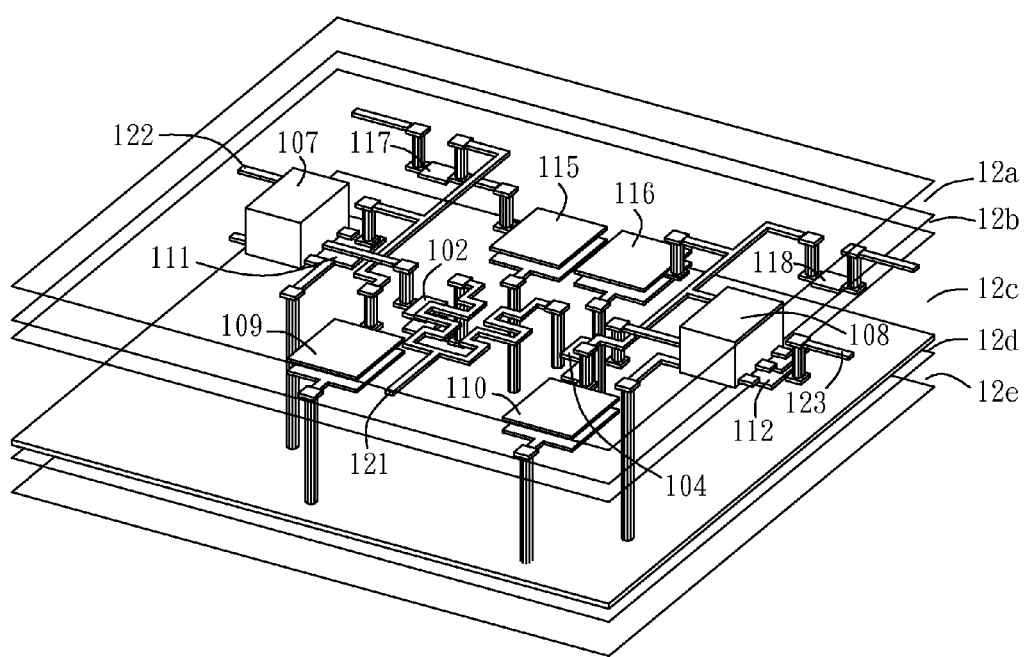
FIG. 4B is a pictorial perspective view of the electronic module shown in FIG. 4.
Figure 4C:
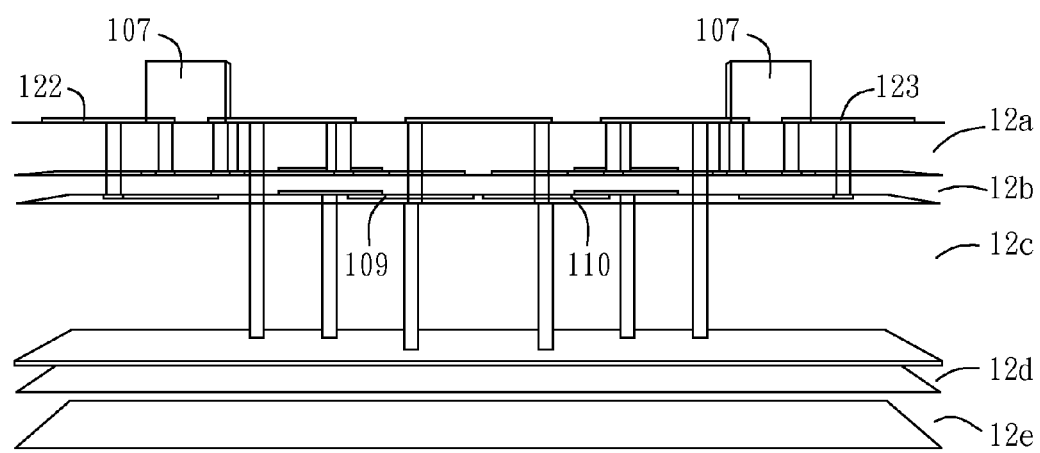
FIG. 4C is a side view of the electronic module shown in FIG. 4.

FIG. 4 is a layout diagram, which illustrates the embodiment of the electronic module having each of the aforementioned kind of passive devices. And FIG. 4A-4C are the schematic diagram, the pictorial perspective view, and the side view of the electronic module shown in FIG. 4, respectively. Referring to FIG. 4, a SPDT switch module 100 includes of an input end 121, two output ends 122 and 123, two resistors 117 and 118, eight capacitors 102, 104, 109, 110, 111, 112, 115, and 116, two inductors 105, 106 and two diode IC (or transistor IC) 107 and 108. The operational principle thereof is to utilize the control signals to control "ON" or "OFF" of the diode IC 107 and 108, making the input signals of the input end 121 being able to selectively output through the output ends 122 or 123 and being as well as a switch. It is noted that the diode IC (or transistor IC) 107 and 108 are shunted to signal grounds. And the resistor 117 or 118 is a part of DC bias circuit. Furthermore, some of the capacitors and inductors constitute matching circuit parts between input/output ends of said SPDT switch module 100; the impedance of any said ends could be matched over a desired bandwidth by using the said matching circuit parts. Thus, the desired high frequency signals could propagate through its route with less loss.

With comparisons to a conventional SPDT module of using surface mount devices (SMD), SPDT switch module 100 of the present invention adopts the surface-type or built-in passive devices of all the aforementioned figures, which is able to reduce the usage area of circuit board effectively. For example, the needed usage area of circuit board for a conventional SPDT switch module 100 is about the size of 1000 mil*400 mil, but those for the presented SPDT switch module 100 having the same operational function is about 440 mil*300 mil, which is 70% less than the conventional one. Furthermore, the benefits of SMD being replaced by built-in passives is that the solder joints of SMD are eliminated, thus the parasitic effects induced by high frequency signals are reduced. So, the performance of SPDT switch module 100 could be improved by using built-in passives.

According to the above-mentioned descriptions, the spirit of the present invention is to manufacture each kind of passive device with a build-up multi-layer structure. For example, the way of using HDI (high density interconnection) build-up multi-layer board to integrate the needed passive devices of a RF switch, i.e. the capacitors, inductors and resistors, into the multi-layer board could be applied to the RF front-end modules for wireless communication or portable electronic products, thereby achieving the goals of reducing cost and miniaturization.

Accordingly, a SPDT switch module having a build-up multi-layer structure, few of resistance devices, capacitance devices and inductance devices are provided in an embodiment of the present invention. The build-up multi-layer structure contains multitudes of conductive layers paralleled each another, wherein two conductive layers are placed on two surfaces of the build-up multi-layer structure; multitudes of dielectric layers, wherein any dielectric layer is separated between any two adjacent conductive layers; and a plurality of conductive connection structures, wherein some conductive connection structures pierce through a portion of dielectric layers to contact and connect to any two conductive layers. Resistance devices are composed of parts of the conductive layers placed on a surface. Capacitance device are composed of an upper polarization plate, a lower polarization plate, two distinct conductive connection structures and two first conductive pads, the upper polarization plate and lower polarization plate are respectively formed of a portion of two distinct and adjacent conductive layers, wherein the two distinct conductive connection structures respectively contacts the upper polarization plate and lower polarization plate, the two distinct conductive connection structures respectively connect any first conductive pad and any first conductive pad is a portion of the conductive layer upon any surface of the build-up multi-layer structure. Inductance devices are composed of at least one conductive coil and two second conductive pads, the conductive coil and the two second conductive pads are a portion of the conductive layer upon any surface of the build-up multi-layer structure and the conductive coil further electrically connects to two second conductive pads.

Although specific embodiments have been illustrated and described, it will be obvious to those skilled in the art that various modifications may be made without departing from what is intended to be limited solely by the appended claims.

What is claimed is:

1. A Single-Pole Double-Throw (SPDT) switch module comprising:
   a symmetrical build-up multi-layer structure, said build-up multi-layer structure comprising:
     a plurality of conductive layers paralleled each another, wherein two of said plurality of conductive layers being placed upon two surfaces of said build-up multi-layer structure;
     a plurality of dielectric layers, wherein any said plurality of dielectric layers being interfered between any two of said plurality of conductive layers; and
     a plurality of conductive connection structures, wherein a portion of said plurality of conductive connection structures piercing through a portion of said plurality of dielectric layers to contact and connect to at least any two of said plurality of conductive layers;
   a resistance device being formed of a portion of the conductive layer;
   a capacitance device having at least an upper polarization plate, a lower polarization plate, distinct two of said plurality of conductive connection structures and two first conductive pads, wherein said upper polarization plate and said lower polarization plate being respectively formed of a portion of any two distinct and adjacent said conductive layers, said distinct two of said plurality of conductive connection structures being respectively contacting said upper polarization plate and said lower polarization plate, said distinct two of said plurality of said conductive connection structures being respectively contacting any said plurality of first conductive pads, and any said plurality of first conductive pads being a portion of the conductive layer placing upon any said surfaces; and an inductance device having at least a conductive coil and two second conductive pads, said conductive coil and said two second conductive pads being a portion of the conductive layer placing upon any said surfaces and said conductive coil being electrically connected to said two second conductive pads.

2. A SPDT switch module according to claim 1, wherein any said plurality of conductive connection structures comprises at least a conductive blind hole penetrating at least one of said plurality of conductive dielectric layers.

3. A SPDT switch module according to claim 2, wherein any said plurality of conductive connection structures further comprises at least a conductive tracking line contacting and connecting to said conductive blind hole.

4. A SPDT switch module according to claim 3, wherein said conductive layer is connected to another said conductive layer by said conductive tracking line.

5. A SPDT switch module according to claim 1, wherein said upper polarization plate and said lower polarization plate have overlapping position between.

6. A SPDT switch module according to claim 1, wherein any said plurality of conductive layers is formed of a copper foil layer.

7. A SPDT switch module according to claim 1 further comprising a diode device fastening upon the conductive layer of any said surfaces.

* * * * *